(12) United States Patent
Jakadar et al.

(10) Patent No.: US 6,694,275 B1
(45) Date of Patent: Feb. 17, 2004

(54) PROFILER BUSINESS MODEL

(75) Inventors: Nickhil Jakadar, Fremont, CA (US); Xinhui Niu, San Jose, CA (US)

(73) Assignee: Timbre Technologies, Inc., Santa Clara, CA (US)

(*) Notice: Subject to any disclaimer, the term of this patent is extended or adjusted under 35 U.S.C. 154(b) by 112 days.

(21) Appl. No.: 09/728,146

(22) Filed: Nov. 28, 2000

Related U.S. Application Data
(60) Provisional application No. 60/209,424, filed on Jun. 2, 2000.

(51) Int. Cl.[7] .......................... G01N 37/00; G06F 19/00
(52) U.S. Cl. .................................................. 702/84
(58) Field of Search ......................... 702/81, 84, 182; 716/4, 19; 438/6, 7, 758; 700/121, 95; 73/865.9; 356/334

(56) References Cited

U.S. PATENT DOCUMENTS

| | | | | |
|---|---|---|---|---|
| 4,287,769 A | * | 9/1981 | Buckley | 73/627 |
| 5,131,752 A | | 7/1992 | Yu et al. | |
| 5,408,322 A | | 4/1995 | Hsu et al. | |
| 5,420,680 A | * | 5/1995 | Isobe et al. | 356/128 |
| 5,479,340 A | | 12/1995 | Fox et al. | |
| 5,503,707 A | * | 4/1996 | Maung et al. | 438/5 |
| 5,539,652 A | * | 7/1996 | Tegethoff | 703/14 |
| 5,608,526 A | | 3/1997 | Piwonka-Corle et al. | |
| 5,661,669 A | * | 8/1997 | Mozumder | 702/84 |
| 5,715,823 A | | 2/1998 | Wood et al. | |
| 5,750,908 A | * | 5/1998 | Drohan | 73/865.9 |
| 5,761,064 A | * | 6/1998 | La et al. | 700/110 |
| 5,886,909 A | * | 3/1999 | Milor et al. | 716/4 |
| 5,901,063 A | * | 5/1999 | Chang et al. | 716/4 |
| 5,907,393 A | * | 5/1999 | Kawano et al. | 356/73 |
| 5,935,735 A | * | 8/1999 | Okubo et al. | 430/5 |
| 6,148,268 A | * | 11/2000 | Wu et al. | 702/84 |
| 6,161,054 A | * | 12/2000 | Rosenthal et al. | 700/121 |
| 6,192,287 B1 | * | 2/2001 | Solomon et al. | 700/110 |
| 6,202,037 B1 | * | 3/2001 | Hattori | 702/182 |
| 6,263,255 B1 | * | 7/2001 | Tan et al. | 700/121 |
| 6,297,880 B1 | * | 10/2001 | Rosencwaig et al. | 356/369 |
| 6,309,780 B1 | * | 10/2001 | Smith | 430/5 |

(List continued on next page.)

FOREIGN PATENT DOCUMENTS

| | | |
|---|---|---|
| WO | WO 98/53581 | 11/1998 |
| WO | WO 00/04427 | 1/2000 |
| WO | WO 01/88955 | 11/2001 |

OTHER PUBLICATIONS

Martin et al. Determination of the optical constants of a semiconductor thin film employing method, Feb. 2000, vol. 43 Isuue:1, pp. 63–68.*

Li, G.G., Optical characterization of silicon–on–insulator, SOI Conference, 1995. Proceedings., 1995 IEEE Intern, pp. 106–107.*

Mudron, J. Optical properties of semi–insulating InP: Fe irradiated by fast neutrons, Advanced Semiconductor Devices and Micorsystems, Oct. 1, 1998, pp. 235–238.*

*Primary Examiner*—John Barlow
*Assistant Examiner*—Demetrius Pretlow
(74) *Attorney, Agent, or Firm*—Morrison & Foerster LLP

(57) ABSTRACT

A quality control system implemented by a service provider for a user via the utilization of sophisticated software algorithms in creating a library of profiles based on product specification. These libraries of profiles are compared with profiles of manufactured products to ensure that manufactured products are within the specification. While the measurement of the manufactured products can be taken in real time, the generation of the profile library is very computationally intensive and requires the use of a highly parallel set of computer workstations for its operation. The system allows for the separation of the computational intensive process from the real-time measurement reading, and creates an opportunity for a service provider to generate and maintain the libraries offsite.

27 Claims, 9 Drawing Sheets

U.S. PATENT DOCUMENTS

| | | | |
|---|---|---|---|
| 6,314,379 B1 * | 11/2001 | Hu et al. | 702/81 |
| 6,326,256 B1 * | 12/2001 | Bailey et al. | 438/238 |
| 6,336,078 B1 * | 1/2002 | Sakayori et al. | 702/81 |
| 6,348,404 B1 * | 2/2002 | Tabara et al. | 438/636 |
| 6,365,427 B1 * | 4/2002 | Gauggel et al. | 438/22 |
| 6,372,646 B2 * | 4/2002 | Ohmi et al. | 438/689 |
| 6,392,756 B1 * | 5/2002 | Li et al. | 356/632 |
| 6,462,817 B1 * | 10/2002 | Strocchia-Rivera | 356/369 |
| 6,485,872 B1 * | 11/2002 | Rosenthal et al. | 430/30 |
| 6,486,492 B1 * | 11/2002 | Su | 257/48 |
| 6,556,947 B1 * | 4/2003 | Scheiner et al. | 702/172 |

* cited by examiner

STEP 400

Continued Next Page

FIGURE 9

Profiler Compiler™ Demo Form

| 1. Customer Contact Information | Account Exec: |
|---|---|
| Company Name: | Primary Contact: |
| Address: | Phone: |
| | Fax: |
| | E-mail: |
| | Cell: |

| 2. Thin Film Stack Structure (See Additive Stack Requirements in Section 5) ||||||
|---|---|---|---|---|---|
| Define the stack structure starting at the upper most film and proceeding downwards to the substrate. Indicate if the layer is patterned, the thickness and the 3σ range in percent. Finally, specify condition of resist (e.g. exposed, baked, developed) and include film in additive stack. ||||||
| Film Description | Patterned (mark x) | Thickness (nm) | 3σ Range (± %) | Resist or Film Processing (expose, bake, develop?) ||
| | ☐ | | | ||
| | ☐ | | | ||
| | ☐ | | | ||
| | ☐ | | | ||
| | ☐ | | | ||
| | ☐ | | | ||

| 3. Pitch, CD and Resolution Specifications    Profile Estimator: ||||||
|---|---|---|---|---|---|
| The layers that have been identified above are listed below along with the minimum and maximum thickness values based on the ranges specified. Input the nominal pitch for the grating, expected bottom CD value and the range in percent over witch it might vary. Finally, the desired resolution for each layer and for the bottom CD value must be specified. ||||||
| Grating Pitch (nm): | Expected Bottom CD (nm): ||| 3σ Range (%): ||
| Films Specified | Thickness Range & Resolution ← Range → (nm) ||| Bottom CD (nm) (Patterned layers only) ||
| | Min | Max | Resolution | Min | Max | Resolution |
| | 0.0 | 0.0 | 1.0 | 0.0 | 0.0 | 1.0 |
| | 0.0 | 0.0 | 1.0 | | | 1.0 |
| | 0.0 | 0.0 | 1.0 | | | 1.0 |
| | 0.0 | 0.0 | 1.0 | | | 1.0 |
| | 0.0 | 0.0 | 1.0 | | | |
| | 0.0 | 0.0 | 1.0 | | | |
| | 0.0 | 0.0 | 1.0 | | | |

Confidentiality Protected Under Non Disclosure Agreement

Figure 9          Profiler Compiler™ Demo Form
(cont'd)

---

4. Profile Definition
Describe below verbally any specific profile shapes that might be expected (e.g. footing or undercuts) so that TIMBRE TECHNOLOGIES can anticipate those shapes in the library generation process.

Profile Shape 1:

Profile Shape 2:

Profile Shape 3:

Profile Shape 4:

Profile Shape 5:

---

5. Additive Stacks
The following specific unpatterned additive stack wafers must be supplied to your TIMBRE TECHNOLOGIES representative for proper n and k extraction:

Wafer 1:    +    +    +    +    +    +

Wafer 2:    +    +    +    +    +

Wafer 3:    +    +    +    +

Wafer 4:    +    +    +

Wafer 5:    +    +

Wafer 6:    +

---

6. Patterned Area Measurements
Patterned area measurements will be made on a periodic grating of at least (120 μm by 100 μm) located on the die or in a scribe line. If measurements are not made on-site, send a detailed wafer map indicating the size and location of the test structures so that the proper measurements can be made. Also, check all boxes to indicate what techniques Phase Profilometry will be compared to:

CD-SEM ☐    AFM ☐    X-SEM ☐    TEM ☐
Other (Specify) _____

General Comments:

---

Confidentiality Protected Under Non Disclosure Agreement

PROFILER BUSINESS MODEL

CROSS REFERENCE TO RELATED APPLICATION

This application claims the benefit of U.S. Provisional Application Ser. No. 60/209,424, entitled PROFILER BUSINESS MODEL, filed on Jun. 2, 2000, the entire content of which is incorporated herein by reference.

BACKGROUND INFORMATION

1. Field of the Invention

The invention relates in general to semiconductor manufacturing and metrology applications, particularly to transactions involved in utilizing a library of profiles to determine whether a wafer product meets a certain specification.

2. Description of Related Art

Metrology is being increasingly utilized in the semiconductor manufacturing industry to ensure that the different process steps are within specifications. There are two different metrology schemes in place today: in-line metrology and integrated metrology. While in-line metrology has become standard today, wherein the product wafers are processed, transferred to a piece of metrology equipment, measured for critical dimension, profile, thickness, etc., and brought back into the line for further processing, integrated metrology is increasingly becoming state-of-the-art. In integrated metrology, the metrology equipment is integrated with the processing equipment so that measurements on the wafer are taken without needing to move the wafers out of the processing equipment, thereby increasing throughput and overall equipment efficiency.

However, even integrated metrology tools have traditionally been hardware based, expensive, and not easily re-configurable. Therefore, it is advantageous to have a new process that shift most of the complexity from expensive and slow hardware tools to sophisticated software algorithms running with relatively simple and inexpensive hardware equipment. This shift to sophisticated software tools, as illustrated in a related co-pending U.S. provisional application No. 60/233,017, now U.S. patent application Ser. No. 09/907,488, entitled "Generation of a Library of Periodic Grating Diffraction Spectra" by Xinhui Nui and Nickhil Harshvardhan Jakatdar, owned by the assignee of this application and incorporated herein by reference, requires a new business model to accommodate the new user and service provider transactions involved in generating the library, managing the data, and billing the user.

SUMMARY OF THE INVENTION

In view of the above, the present invention provides the processes that leverage the use of sophisticated software algorithms in creating a library of profiles based on product specification. These libraries of profiles are compared with profiles of manufactured products to ensure that manufactured products are within the specification. A novel set of software algorithm is used with simpler hardware configurations. The software is broken into two parts: the front-end and the back-end. While the front-end can run in real time and is installed either on a metrology equipment computer or a stand-alone computer at a user site, the back-end software is very computationally intensive and requires the use of a highly parallel set of computer workstations for its operation. This separation of the computational intensive process allows for a service provider to generate and maintain the libraries offsite.

BRIEF DESCRIPTION OF THE DRAWINGS

FIG. 9 is a pictorial representation of the profiler compiler form that provides the information required to generate a library.

DETAILED DESCRIPTION OF PREFERRED EMBODIMENT

Figure 2:
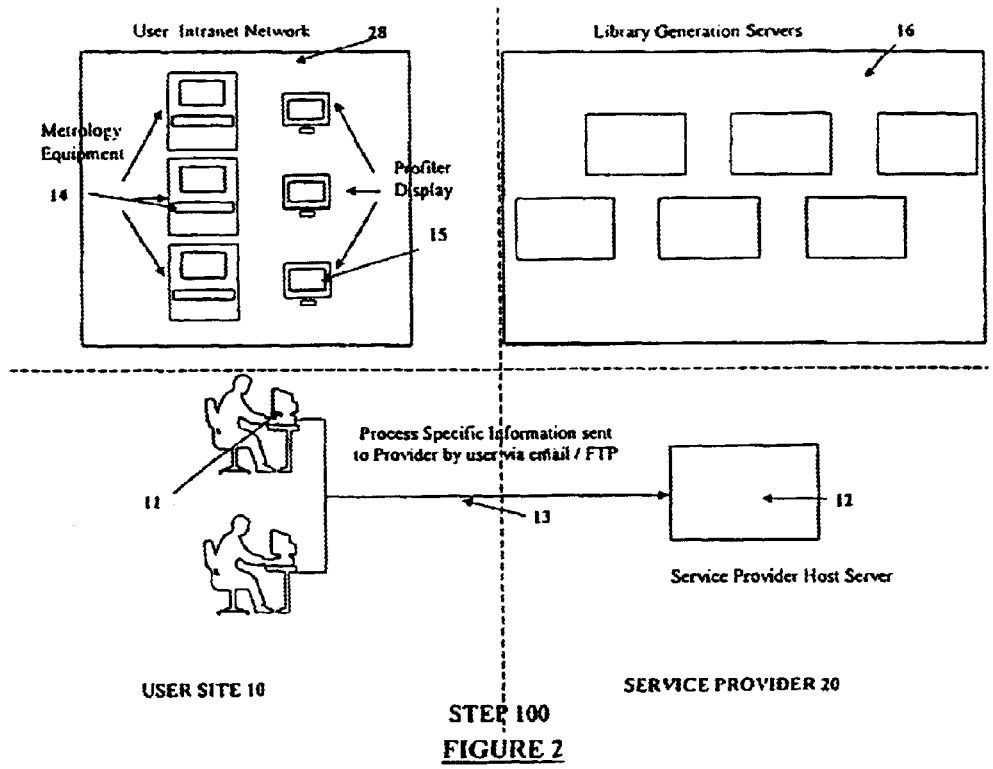
FIGS. 2, 4, 5 and 6 illustrate the step-by-step information flow between the user and the service provider.

The elements of the quality control program in accordance with the invention consist a user-site component 10 and a service provider component 20, as illustrated in FIG. 2.

Figure 1:
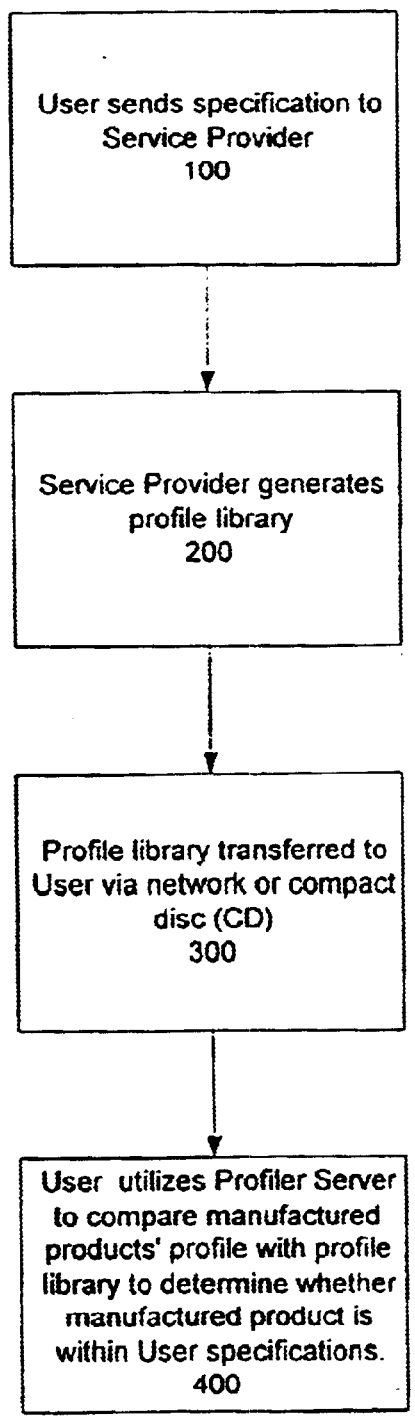
FIG. 1 is a logic flow chart of a quality control program utilizing a profile library implemented by a service provider for a user.

As illustrated in FIG. 1 the service provider 20 implements for the user a quality control program that utilizes a library of profiles generated by the service provider. The user 10 utilizes a computing machine 11 to communicate product specification to service provider 20 via a network such as the Internet, local area network (LAN) and/or wide area network (WAN), wireless and/or wired, or other network infrastructure 100. Additionally, the specification can be provided to service provider via a meeting. After gathering the information, service provider 20 generates a profile library 200. In step 300, the profile library is transferred to user computing machine 11 via a network or manually downloaded from a compact disc (CD) or any storage medium that can hold the profile library. When a product is manufactured, the product is measured for its profile and that profile is compared to the library to determine whether the manufactured product is within user specifications 400.

In the corresponding FIGS. 2, 4, 5, 6, the steps 100, 200, 300, and 400 are shown in greater detail. As illustrated in FIG. 2, the user will collect information about the process, such as the range of critical dimensions, film thickness, broadband optical constants for each film and angle of incidence of the metrology hardware to be used. The user inputs the information into a profiler compiler, the software package resident on the user's computing machine 11. Once this information is entered, it is encrypted, compressed and sent either over the Internet or via email 13 to service provider host server 12. At this point, the library specifications and user name are recorded into the host server 12.

Figure 3:
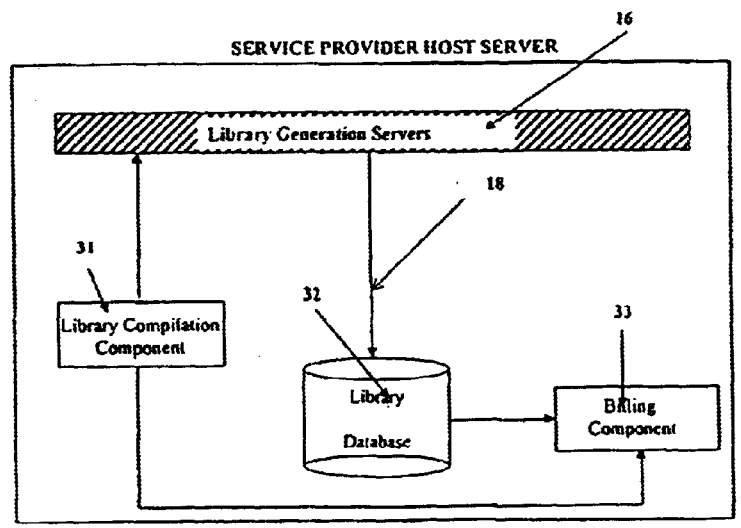
FIG. 3 illustrates the internal architecture of the service provider host server.
Figure 4:
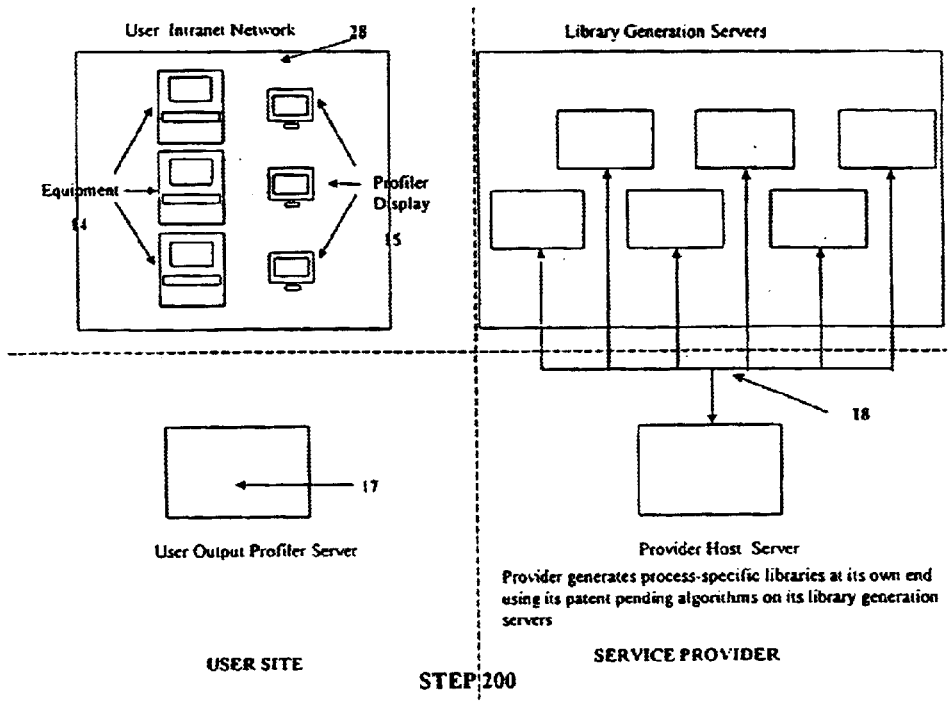

FIG. 3 illustrates the events that take place in the host server 12. The specifications of the library are decompressed and decrypted in a library compilation component 31 and distributed over one or more library generation servers 16. The information is also recorded in a billing component 33 to enable tracking of user name, user authorization, method of payment, and payment transactions. FIG. 4 shows an automated distribution process of the library generation along with a network architecture 18. The library generation process can take anywhere from a few minutes to many days, depending on the size of the library specified. The library is generated by the library generation servers 16 via a simulation method using optical spectroscopic signals and coupled wave algorithms. Once this process is complete, the library compilation component 31 aggregates the library from the different library generation servers, performs an automated quality control check, and sends it to a library database 32. The process of having generated a library for a particular customer is recorded in the billing component 33.

In one embodiment, the user would sign on by pre-paying for a certain number of libraries. The billing component has a counter that is originally set to the number of libraries that the user has pre-paid for. This counter counts down to zero, deducting one count for every library that is generated for the particular user. The billing component 33 would come into effect twice for every library request. The first time that a job has been submitted for library generation, a check is made with the billing component 33 to ensure that indeed the customer has an active account. At this step, a library generation in progress field is created. The billing component 33 is accessed again when the library is ready to be sent back to the customer. At this point, the counter deducts one count and checks off the library-generation-in-progress field. This ensures that there are no jobs waiting in queue for more than a specified amount of time.

Alternatively, the user would pay a monthly or annual subscription fee that would allow the user access to unlimited number of libraries in that time period. The transactions in this model would also be recorded at the service provider host server, which checks to ensure that the particular customer has indeed signed up for the subscription fee service. The billing component 33 would come into effect twice for every library request. The first time that a job has been submitted for library generation, a check is made with the billing component 33 to ensure that indeed the customer has an active account. At this step, a library generation in progress field is created. The second time the billing component 33 is accessed when the library is ready to be sent back to the customer. At this point, it checks off the library-generation-in-progress field. This ensures that there are no jobs waiting in queue for more than a specified amount of time.

Figure 5:
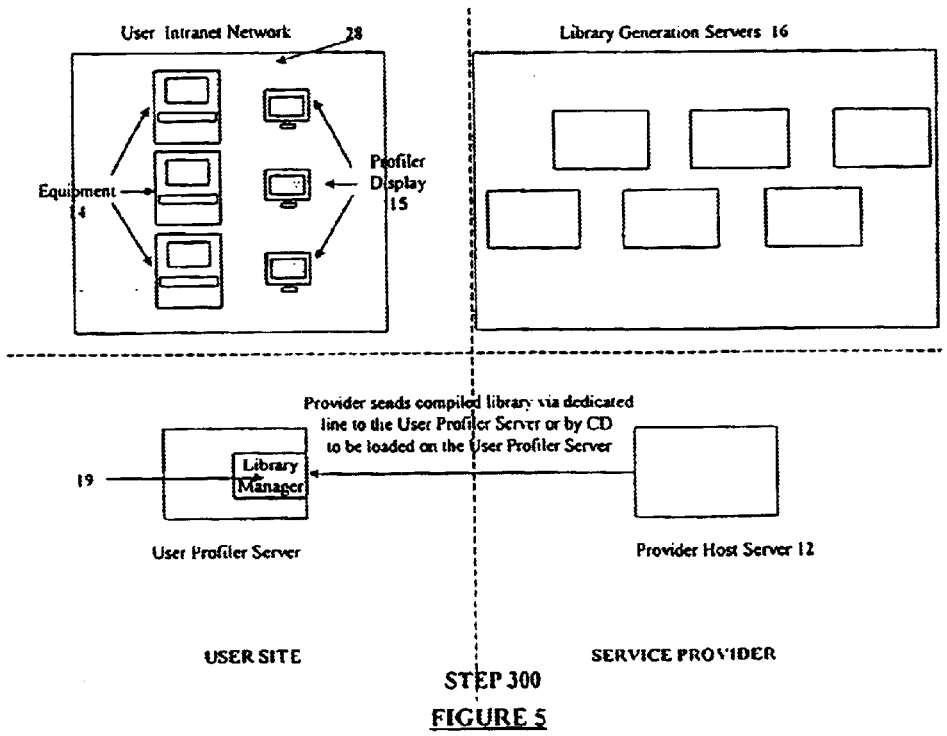

Once the quality control procedure is completed, the library can then either be sent back to the customer over a dedicated line or sent as a compact disc (CD) or any storage medium, as illustrated in FIG. 5. In either case, the library is loaded onto a profiler application server 17 through a library manager 19. The term profiler application server, as described herein is defined as a server, which uses spectroscopic optical data and spectra matching algorithms to compare measured spectra to a library of simulated spectra generate profiles for a certain material stack, to determine parameters of interest such as critical dimension (CD) or cross-sectional profile (xP). The library manager 19 organizes the various libraries according to the respective material stack into the database.

Figure 6:
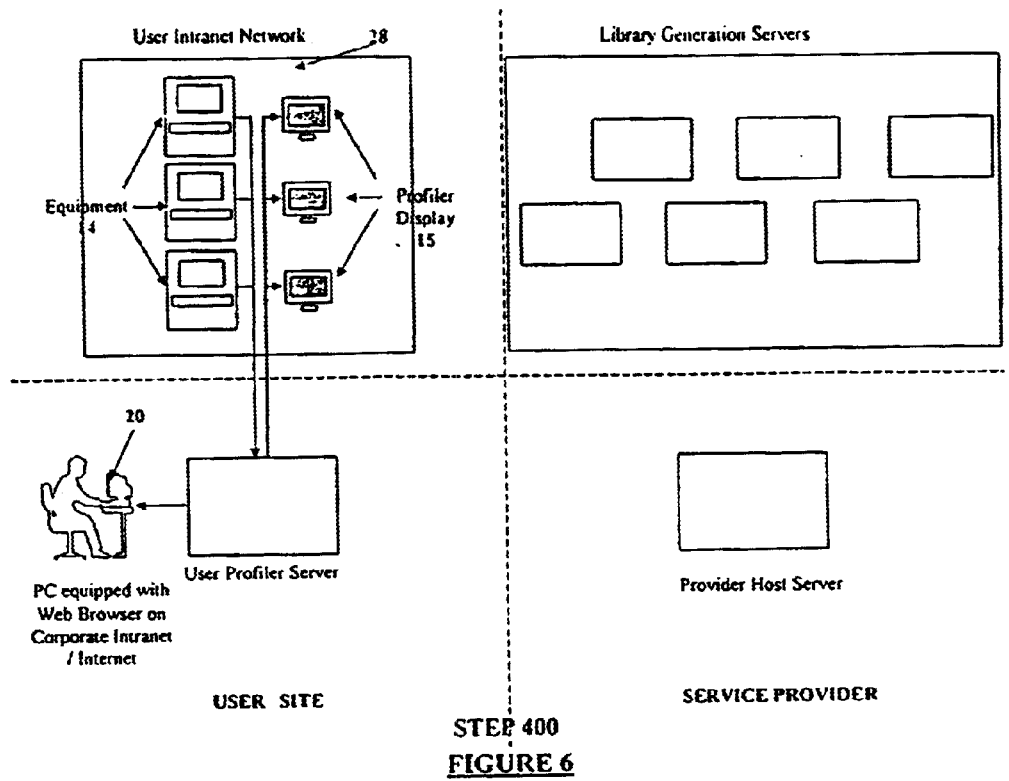
Figure 7:
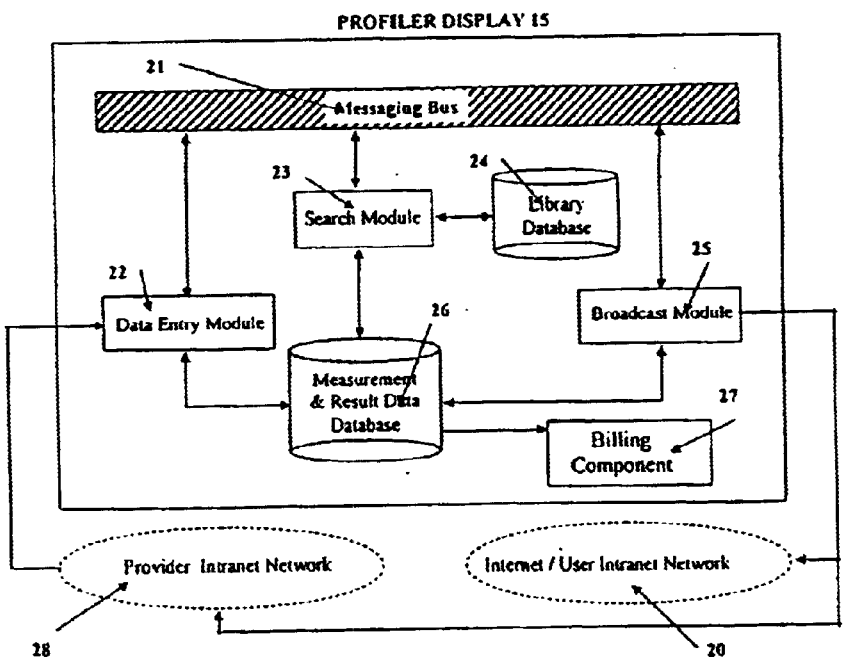
FIG. 7 illustrates the internal architecture of the profiler application server.

As shown in FIG. 6, the library is used for real time comparison with metrology equipment measurements taken at user site. This enables user to verify that the manufactured products are within specifications. Alternatively, the system can contain a corrective module to change the manufactured process if manufactured product differs from the specifications. A metrology equipment 14 makes the measurement. This measurement is then sent either via a network connection or using a Semiconductor Equipment Communication Standard (SECS) protocol 28 to a profiler application server 17 and then to a profiler display 15 that displays the matching results and analysis. Alternatively, a profiler application server can be coupled with a plurality of profiler display 15. FIG. 7 illustrates the internal components of the profiler application server 17. The measurement is sent via the provider intranet network 28 to a data entry module 22 that stores the acquired measurement along with the date stamp, lot information and other details of the process into a measurement and result database 26. Simultaneously, it also broadcasts the fact that a measurement has arrived to a messaging bus 21. This broadcast is acknowledged by a search module 23, which accesses the appropriate library from the library database 24 and finds the best fit for either thickness (in case of un-pattered film measurements) or profile and underlying thickness (in case of patterned film measurements). A copy of the result corresponding to the measurement is saved in the measurement and result database 26. At this point, the messaging bus 21 broadcasts a message letting users know that new data has arrived in the measurement and result database 26. This database can be accessed over an intranet or the Internet 29 for users to view historical data as well as for data analysis and data mining applications.

In an alternative billing scheme, the user is charged only a nominal fee for the number of libraries generated or for a periodical subscription fee. In addition to the nominal fee, the customer is charged based on the number of metrology measurements that are compared to the library to extract thickness (in case of un-patterned films) or profile and underlying thickness (in case of patterned films). A billing component 27 in the profiler application server 17 accesses the measurement and result database 26 every time a result is obtained and broadcast on the messaging bus 21. This billing component 27 can then either be accessed by service provider over the Internet or an encrypted file containing the number of hits can be sent by the customer to service provider periodically so that user can be billed according to the number of comparison requests.

Figure 8:
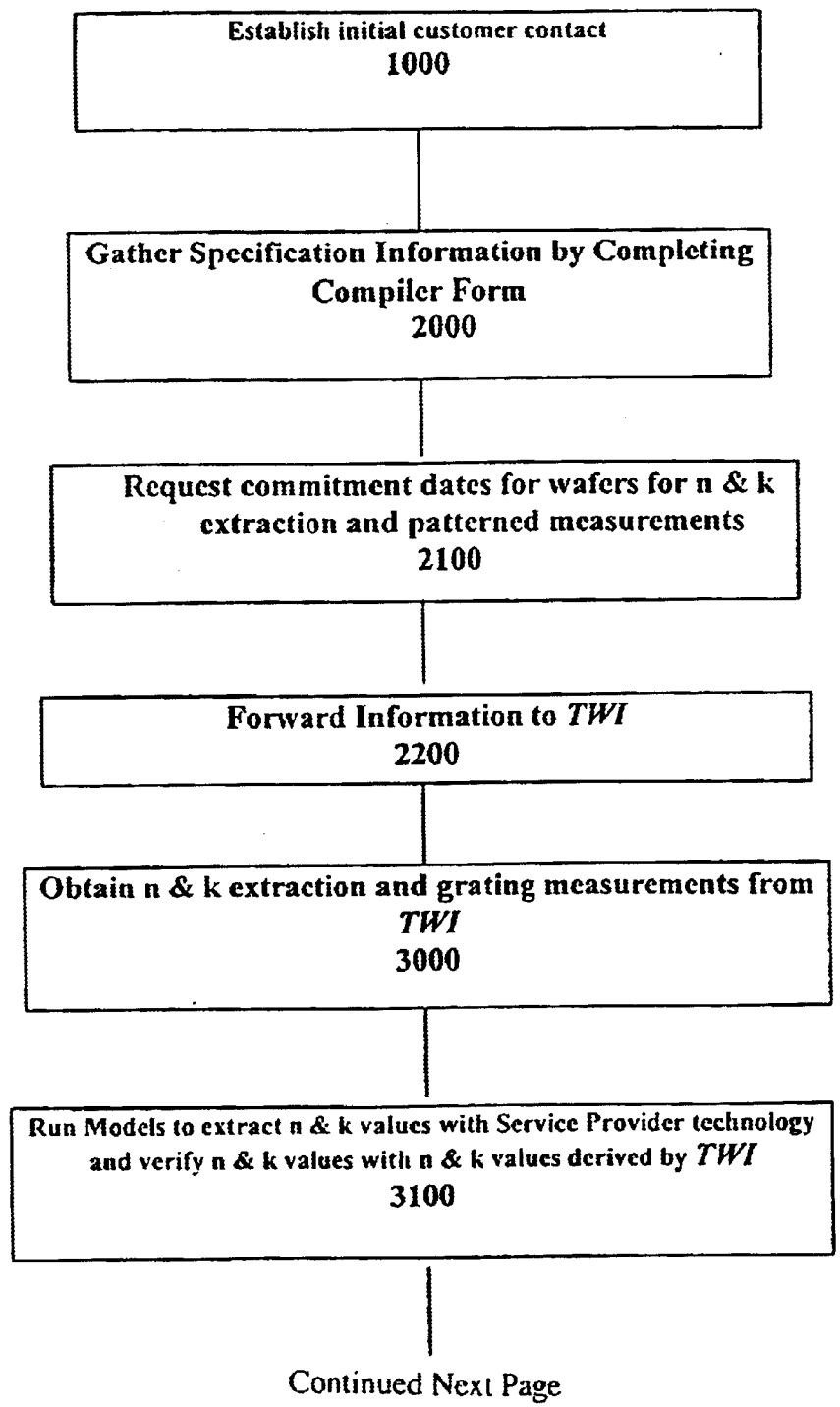
FIG. 8 is a detailed flow chart of the transactions involved in generating a library and library report summary.
Figure 8:
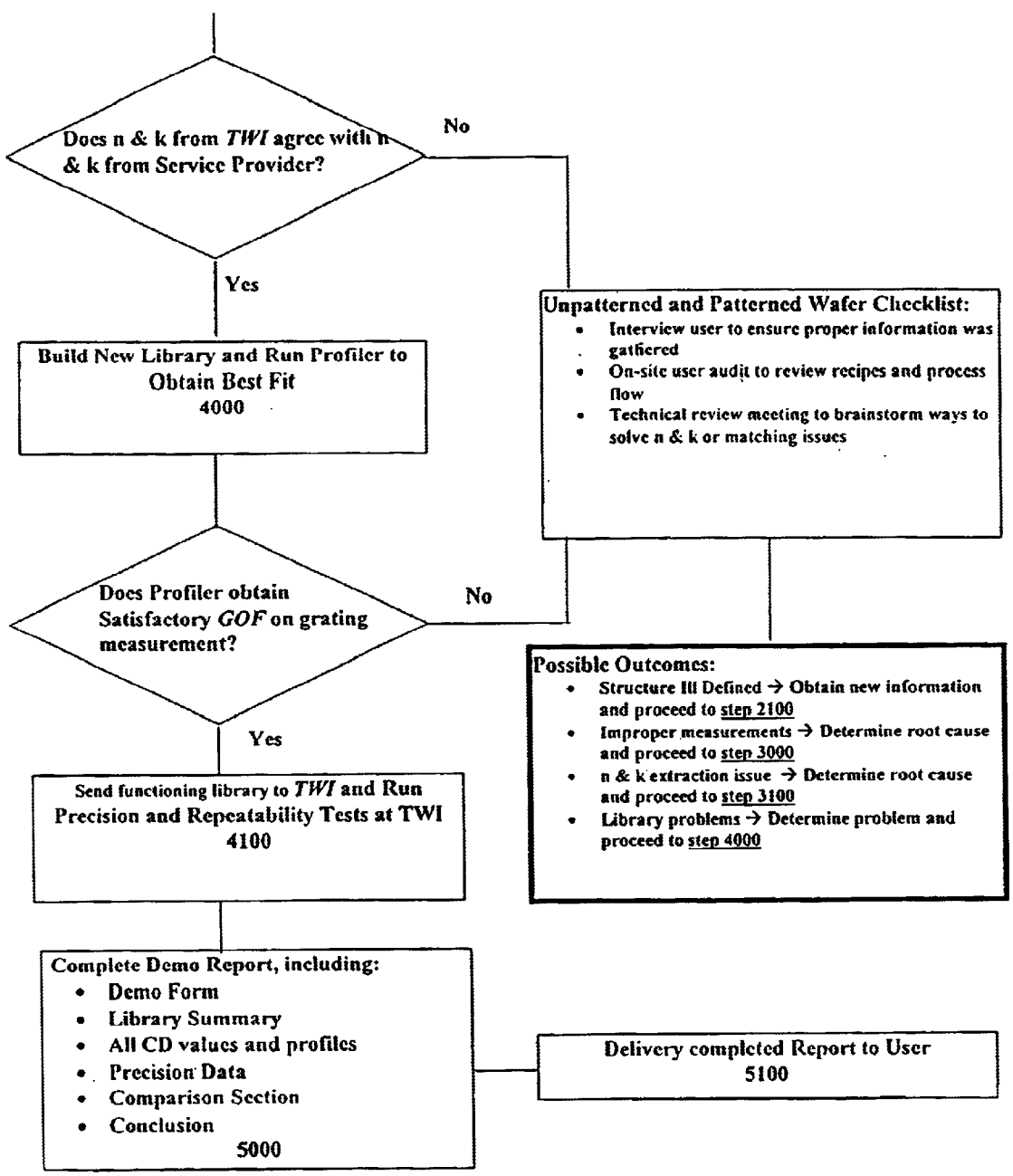

In FIG. 8, a more detailed flow chart of the transactions involved in generating a library and library report summary is shown. Service provider initially establishes customer contact to discuss attributes of a profiling method 1000, as discussed in co-pending provisional application referenced above. One profiling method is to obtain the critical dimension (CD) and cross-sectional profile (xP) information via optical spectroscopic critical dimension phase profilometry technique. Phase profilometry enables real-time CD and cross sectional equivalent, xP profile, information to be gathered simultaneously with a single measurement. The measurement is made on a test site consisting of a regularly repeating grating using any spectroscopic optical equipment such as spectroscopic ellipsometry (SE), spectroscopic reflectometry (SR), and etc. CD and profile information are extracted by comparing the spectrum gathered from the SE to a profile library in the library database 24 on the profiler application server 17, as illustrated in FIG. 7. The profile library is an electronic collection of spectra-profile pairs custom generated by the library generation servers 16, as illustrated in FIG. 3. The library can be quickly and efficiently searched to find the optimum CD and xP values. To ensure that the method is robust, the library must be representative of the film stack that is being measured. Therefore, specific information needs to be gathered and verification of various parameters is required to ensure integrity of the libraries.

Figure 10:
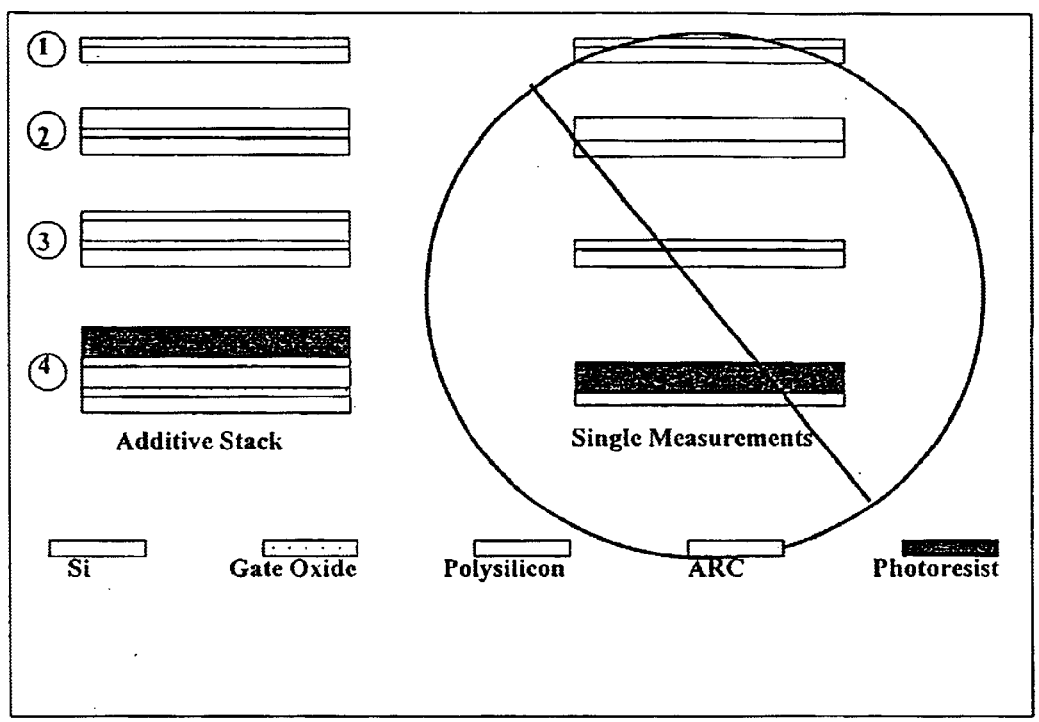
FIG. 10 is a pictorial representation of the additive stack concept for taking measurements.

After user decides to procure the service provider's quality control program, service provider needs to gather specification information such as customer information, thin film stack structure, pitch, CD, resolution, additive stack information, and patterned area measurements, as illustrated in FIG. 9. User supplies specific un-patterned additive stack wafers or measurements thereof to service provider for refractive indices (n) and extinction coefficients (k) measurements 2100. This is required to generate the most precise library utilizing the phase profilometry method. Accurate n and k values can be extracted for each of the films separately and successively via an additive film stack approach by the service provider, the customer, or an n and k extraction service provider. This method allows the most accurate and robust n-k extraction, and is accomplished by measuring successive layers of the deposited films and extracting n and k for each layer. For example, as illustrated in FIG. 10, in a poly gate stack, (photoresist+ARC+polysilicon+silicon dioxide on Si), the films would be measured with the opti-probe method after: 1) the gate oxide is grown, 2) the Poly-silicon is deposited, 3) the ARC is spun-on or deposited, and 4) after the resist is spun on and baked. Individual film depositions directly on silicon are not recommended, since that method is unable to measure and account for the optical properties of each interface that are present in production stacks.

Once the information is gathered and the additive wafer stacks or measurements thereof are obtained, the information and wafer stack are sent to n and k extraction service provider, or 'Thin-Film Wafer Inspection ("TWI")', 2200. The n and k extraction service provider takes the n and k extraction and grating measurement 3000. Alternatively, the n and k values can be extracted on customer site. In 3100, service provider will run models to extract n and k values based on the novel set of algorithm. A new library is generated and the provider host server 12 is utilized to obtain the best-fit 4000. After generation of the library, a verification measure is instituted, as the provider host server 12 would check to see whether a satisfactory goodness of fit ("GOF") on the grating measurement is obtained. If goodness of fit is not obtained, service provider and user will try to resolve problem 6000. If goodness of fit is obtained, the library is sent to a verification service provider, which will perform precision and repeatability tests on the library 4100. Once verification tests are done, a report, including demo form, library summary, all CD values and profiles, precision data, comparison data, and conclusion is completed 5000 and sent to user 5100.

The above embodiments are only illustrative of the principles of this invention and are not intended to limit the invention to the particular embodiments described. One skilled in the art should recognize that manufactured product could include all types of product that can have profiles made based on the profiling method described herein. Accordingly, various modifications, adaptations, and combinations of various features of the described embodiments can be practiced without departing from the scope of the invention as set forth in the appended claims.

We claim:

1. A method for implementing a quality control program for a user by a service provider, the method comprising the steps of:
    transferring specification of a product from the user to the service provider;
    generating a profile of the product based on the specifications to create a library, wherein said profile is generated via software that uses optical spectroscopic signals and coupled wave algorithms; and
    comparing said library to one or more profiles of a manufactured product to ensure that said manufactured product is within the specification.

2. The method of claim 1, wherein the specification is transferred to the service provider via the Internet or an intranet.

3. The method of claim 1, wherein the product is a wafer product.

4. The method of claim 1, further comprising the step of encrypting the library to restrict access by non-authorized users.

5. The method of claim 1, further comprising the step of billing the user for the library.

6. The method of claim 5, wherein the billing is based on the number of libraries generated.

7. The method of claim 5, wherein the billing is based on a periodical subscription fee.

8. The method of claim 5, wherein the billing is based on the number of comparisons made between a manufactured product and the library.

9. The method of claim 1, further comprising the step of extracting refractive indices (n): and extinction coefficients (k): values utilized in generating the profile.

10. The method of claim 1, further comprising the step of verifying the library for goodness of fit.

11. The method of claim 10, further comprising the step of correcting a parameter utilized in generating the library if goodness of fit is not achieved.

12. A quality control system to ensure a product meets specifications comprising:
    a user-input module to transmit specifications to service provider;
    a server to provide a library of profiles based on the specifications, wherein the profile is generated by utilizing software that uses optical spectroscopic signals and coupled wave algorithms; and
    a user-profiler to compare a profile of a manufactured product with the library profile based on said specifications.

13. The system of claim 12, wherein the user and the server is coupled via a network.

14. The system of claim 12, further comprises a billing component that tracks the number of libraries generated.

15. The system of claim 14, wherein the billing component tracks the number of comparisons made between a manufactured product and the library.

16. The system of claim 14, wherein the billing component tracks usage based on time.

17. The system of claim 12, wherein the result of the comparison is provided in real time.

18. The system of claim 12, further comprising a corrective module to alter a manufacturing process based on results from the comparison between the manufactured product and the library.

19. A method for implementing a quality control program for a user by a service provider, the method comprising:
    receiving specifications of a semiconductor wafer from the use at the service provider; and
    generating a profile of a structure formed on the semiconductor wafer based on the specifications to create a library, wherein the profile is generated via software that uses optical spectroscopic signals and coupled wave algorithms.

20. The method of claim 19, wherein the specification is transferred to the service provider via the Internet or an intranet.

21. The method of claim 19, further comprising:
    comparing the library to one or more profiles of a manufactured semiconductor wafer to ensure that the manufactured semiconductor wafer is within the specification.

22. The method of claim 19, further comprising:

extracting refractive indices (n); and extinction coefficients (k): values utilized in generating the profile.

23. The method of claim 19, further comprising:

verifying the library for goodness of fit.

24. The method of claim 24, further comprising;

correcting a parameter utilized in generating the library if goodness of fit is not achieved.

25. A system to ensure a semiconductor wafer meets user specifications, the system comprising:

a server configured to provide a library of profiles of structures formed on a semiconductor wafer based on specifications received from a user via a computer network, wherein the profile is generated by utilizing software that uses optical spectroscopic signals and coupled wave algorithms; and a user-profiler to compare a profile of a manufactured semiconductor wafer with the library profile based on the specifications.

26. The system of claim 25, wherein the result of the comparison is provided in real time.

27. The system of claim 25, further comprising:

a corrective module to alter a manufacturing process based on results from the comparison between the manufactured semiconductor wafer and the library.

* * * * *